(12) United States Patent
Blevins et al.

(10) Patent No.: US 8,788,069 B2
(45) Date of Patent: Jul. 22, 2014

(54) METHOD AND APPARATUS FOR ELIMINATING ALIASING

(75) Inventors: Terrence L. Blevins, Round Rock, TX (US); Mark J. Nixon, Round Rock, TX (US)

(73) Assignee: Fisher-Rosemount Systems, Inc., Round Rock, TX (US)

( * ) Notice: Subject to any disclaimer, the term of this patent is extended or adjusted under 35 U.S.C. 154(b) by 403 days.

(21) Appl. No.: 13/246,305

(22) Filed: Sep. 27, 2011

(65) Prior Publication Data

US 2013/0079901 A1    Mar. 28, 2013

(51) Int. Cl.
*G06F 19/00* (2011.01)

(52) U.S. Cl.
USPC ............................................ 700/71; 708/322

(58) Field of Classification Search
USPC ................... 700/71, 79; 341/143, 163, 172; 375/340; 600/306; 708/319, 300
See application file for complete search history.

(56) References Cited

U.S. PATENT DOCUMENTS

| | | | |
|---|---|---|---|
| 5,202,821 A | | 4/1993 | Bauck et al. |
| 5,206,919 A * | | 4/1993 | Keating ........................ 382/296 |
| 5,322,998 A * | | 6/1994 | Jackson ........................ 250/216 |
| 5,676,141 A | | 10/1997 | Hollub |
| 5,875,109 A | | 2/1999 | Federspiel |
| 5,970,430 A | | 10/1999 | Burns et al. |
| 6,285,966 B1 | | 9/2001 | Brown et al. |
| 6,937,283 B1 * | | 8/2005 | Kessler et al. ................ 348/342 |
| 7,231,265 B2 | | 6/2007 | Yasui et al. |
| 7,436,911 B2 * | | 10/2008 | Fudge et al. .................. 375/340 |
| 7,873,686 B2 * | | 1/2011 | Elfataoui et al. .............. 708/319 |
| 7,994,805 B2 * | | 8/2011 | Chen ........................ 324/750.26 |
| 2007/0050439 A1 * | | 3/2007 | Elfataoui et al. .............. 708/300 |

FOREIGN PATENT DOCUMENTS

| | | |
|---|---|---|
| CN | 101221422 A | 7/2008 |
| EP | 2 378 382 A2 | 10/2011 |
| GB | 2 386 437 A | 9/2003 |

OTHER PUBLICATIONS

Atsumi et al., Vibration Control Above the Nyquist Frequency in Hard Dusk Drives, 2006, Ieee, p. 103-108.*
Harris et al. Digital Recieivers and Transmitters Using Polyphase Filter Banks for Wireless Communication, Apr. 2003, Ieee, p. 1395-1412.*
Combined Search and Examination Report for Application No. GB1217064.3, dated Mar. 15, 2013.

* cited by examiner

*Primary Examiner* — Kidest Bahta
(74) *Attorney, Agent, or Firm* — Marshall, Gerstein & Borun LLP

(57) ABSTRACT

In order to reduce or eliminate aliasing in a process control network, filtering of a measurement signal may be set based on the module execution rate in a process control system. A Nyquist frequency for the module may be determined based on the module execution rate where the Nyquist frequency may be twice the execution rate. Filtering after an analog to digital convertor may be set based on the module execution rate. In the analog to digital convertor, digital filtering after the converter may be set based on the module execution rate and the frequency content of the analog signal may be attenuated by a filter at and above the Nyquist frequency for the module execution rate.

20 Claims, 8 Drawing Sheets

METHOD AND APPARATUS FOR ELIMINATING ALIASING

BACKGROUND

Process plants, like those used in chemical, petroleum, or other processes, typically include one or more centralized or decentralized process controllers communicatively coupled to at least one host or operator workstation and to one or more process control and instrumentation devices, such as field devices, via analog, digital or combined analog/digital buses. Field devices, which may be, for example valves, valve positioners, switches, transmitters, and sensors (e.g., temperature, pressure, and flow rate sensors), perform functions within the process such as opening or closing valves and measuring process parameters. The process controller receives signals indicative of process measurements or process variables made by or associated with the field devices and/or other information pertaining to the field devices via the communication buses, uses this information to implement a control routine, and then generates control signals which are sent over one or more of the buses to the field devices to control the operation of the process. Information from the field devices and the controller is typically made available to one or more applications executed by an operator workstation to enable an operator to perform desired functions with respect to the process, such as viewing the current state of the process, modifying the operation of the process, etc.

In the past, conventional field devices were used to send and receive analog (e.g., 4 to 20 milliamps) signals to and from the process controller via an analog bus or analog lines. These 4 to 20 mA signals were limited in nature in that they were indicative of measurements made by the device or of control signals generated by the controller required to control the operation of the device. However, in the past decade or so, smart field devices that perform one or more process control functions have become prevalent in the process control industry. In addition to performing a primary function within the process, each smart field device includes a memory and a microprocessor having the capability to store data pertaining to the device, communicate with the controller and/or other devices in a digital or combined digital and analog format, and perform secondary tasks such as self-calibration, identification, diagnostics, etc. A number of standard, open, digital or combined digital and analog communication protocols such as the HART®, PROFIBUS®, FOUNDATION™ Fieldbus, WORLDFIP®, Device-Net®, and CAN protocols have been developed to enable smart field devices made by different manufacturers to be interconnected within a process control network to communicate with one another, and to perform one or more process control functions.

The different function blocks within a process plant are configured to communicate with each other (e.g., over a bus) to form one or more process control loops, the individual operations of which are spread throughout the process and are, thus, decentralized. In continuous and batch control systems, the module acts as a container of measurement, calculation, and control implemented as function blocks. As defined in ISA88, a control module is a container of measurement, calculations, and control implemented as function blocks and may contain other control modules. In general, the period of execution of a module, also known as the module execution rate, may be set by the end user of the control system based on the process speed of response to changes in process inputs. As noted above, to maintain efficient operation of the overall process, and thus minimize plant shutdowns and lost profits, devices associated with the process plant must function properly and reliably. Typically, one or more experienced human operators are primarily responsible for assuring that the devices within a process plant are operating efficiently and for repairing and replacing malfunctioning devices. Such operators may use tools and applications, such as the ones described above, that provide information about devices within the process.

Analog signals from field devices are often sampled and converted to digital signals using analog to digital convertors. In sampling, a snapshot of the signal is taken at several points in time and the signal is measured at each point in time. It has been long known in communication theory that a minimum sampling rate is required to accurately process a signal. Specifically, Shannon's Theorem states that to be able to accurately represent a signal, it is necessary to sample at least two times as fast as the highest-frequency content in the signal. If a signal is sampled at a lower rate, then the signal is distorted by higher frequencies being incorrectly interpreted as lower frequencies. For example, under a stroboscopic light a rotating wheel may appear to be moving backwards. In analog input processes, as Shannon's Theorem predicts, aliasing will occur if the sample rate is not at least two times as fast as the highest frequency contained in the measurement signal. The distortion introduced by aliasing may be caused by process or electrical noise contained in the measurement signal.

SUMMARY

A method and system for eliminating aliasing in a signal is disclosed. By sampling the signals in field devices at twice the highest frequency in a measurement signal and then filtering the digital value at that rate to reduce the frequency content to eliminate frequencies higher than the process control module Nyquist frequency, aliasing will be reduced, if not eliminated.

A module execution rate in the process control system may be set and a Nyquist frequency for the module may be determined based on the module execution rate where the module Nyquist frequency is defined as twice the module execution rate. The filtering that must be applied to the sampled measurement may be set based on the module execution rate. The sample rate of the analog to digital converter that samples the measurement signal must be execute at a rate that is at least twice the highest frequency contained in the measurement signal.

A system for reducing aliasing in a process control system also is disclosed. A process control module in the process control system operates at a determined execution rate where the process control system includes field devices, an analog to digital convertor and a controller. The controller calculates the Nyquist frequency for the process control module based on the execution rate of the module. An analog to digital convertor that is in communication with at least one of the field devices includes a filter that attenuates signals above the module Nyquist frequency as part of the conversion from analog form to digital form.

The advantages to the system and method include providing more accurate readings from field devices. As a result, better control and performance of the plant process is possible based on the more accurate data. These advantages eliminate the need for costly plant process errors and related corrections.

SPECIFICATION

Process Control Network

Figure 1:
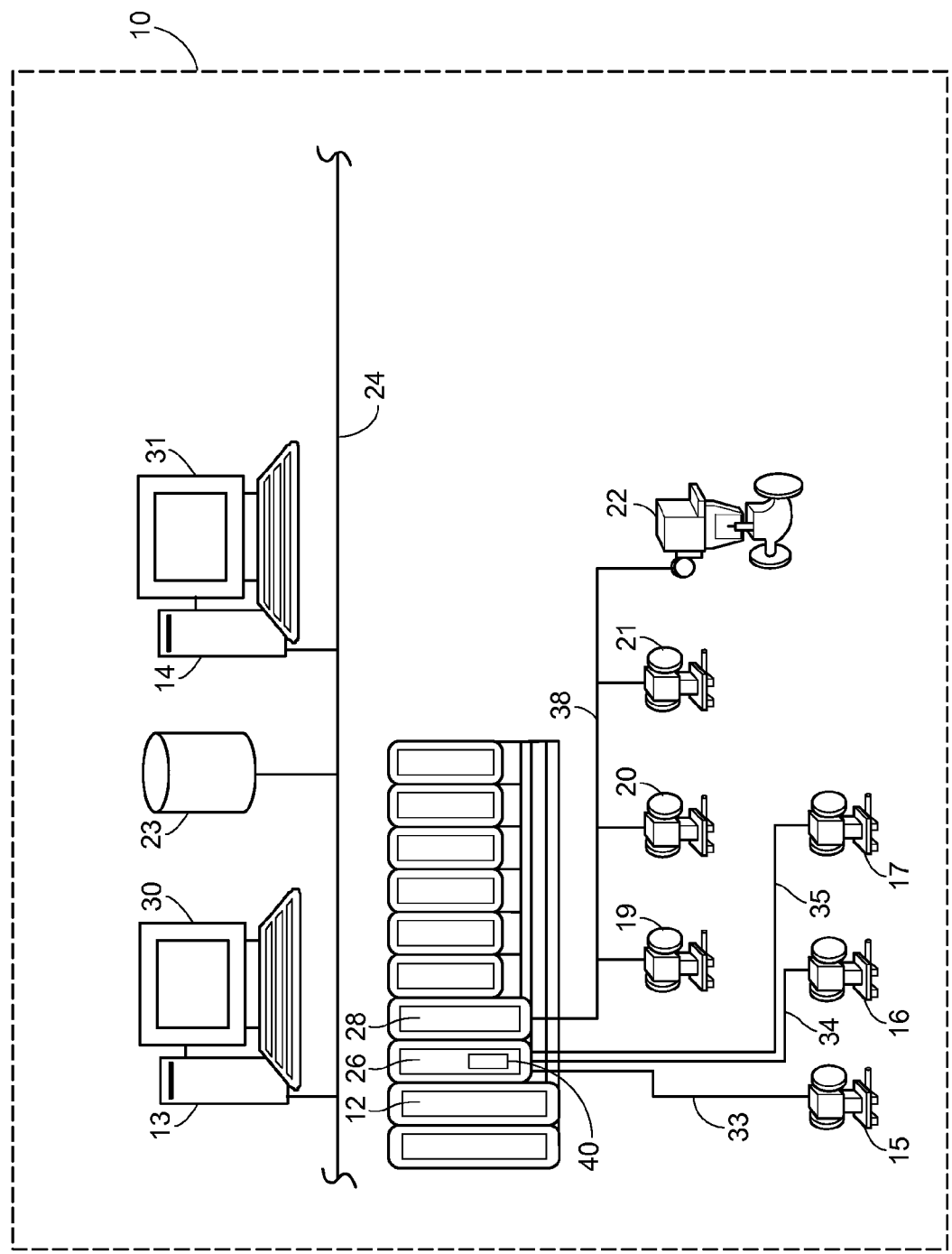
FIG. 1 is a schematic block diagram of a process plant that uses the method and apparatus to eliminate aliasing.

Referring now to FIG. 1, a process plant 10 includes a plurality of field devices 15-22 connected to a process controller 12 via one or more input/output devices 26 and 28. The process controller 12 may be a distributed control system (DCS) type controller such as, for example, a Delta V™ controller sold by Fisher-Rosemount Systems, Inc., or any other type of controller for use in controlling field devices 15-22 that are connected to the process controller 12 in any conventional or any other desired manner. As shown in FIG. 1, the process controller 12 is communicatively coupled to one or more operator workstations 13 and 14 via a bus 24. The bus 24 may be wired or wireless, for example, an Ethernet-based bus and may use any desired or suitable local area network (LAN) or wide area network (WAN) protocol to provide communications. The operator workstations 13 and 14 may be based on a personal computer platform or any other suitable processing platform, and may perform a variety of known process control, maintenance, and other functions. The operator workstations 13 and 14 may be local at the plant or may be remote and may communicate with the controller using a variety of protocols and a variety of communication devices. In addition, the process plant 10 may include a data historian 23 that collects process control data via the bus 24. The data historian 23 is well known in the art and, thus, will not be described in further detail.

As is known, the process controller 12 may store and implement a control scheme to effect measurement and control of devices within the process to thereby control process parameters according to some overall control scheme. The process controller 12 may report status information to one or more applications stored within, for example, the operator workstations 13 and 14 regarding the operating state of the process and/or the operating state of the field devices 15-22. Of course, these applications may display any desired information to an operator or to a maintenance person within the process plant 10 via display devices 30 and 31 associated with operator workstations 13 and 14, respectively. It is to be understood that the process plant 10 illustrated in FIG. 1 is merely exemplary in nature and other types or configurations of process plants can be used as well.

The field devices 15-22 may be any types of devices, such as sensors, valves, transmitters, positioners, etc. while the I/O devices 26 and 28 may be any types of I/O devices conforming to any desired communication or controller protocol. As shown in FIG. 1, the process controller 12 is communicatively coupled to conventional (i.e., nonsmart) field devices 15-17 via analog lines 33-35. Field devices 15-17 maybe standard 4-20 mA analog field devices that communicate over analog lines 33-35 to the I/O device 26. An analog to digital convertor 40 may be part of the input device 26. In another embodiment, the analog to digital convertor 40 may be separate from the input device 26 but may be in communication with the input device 26.

Similarly, field devices 19-22 may be smart devices, such as Fieldbus field devices, that communicate over a digital bus 38 to the I/O device 28 using Fieldbus nonproprietary protocol communications. Generally speaking, the Fieldbus protocol is an all-digital, serial, two-way communication protocol that provides a standardized physical interface to a two-wire loop or bus that interconnects field devices 19-22. The Fieldbus protocol provides, in effect, a local area network for field devices 19-22 within the process plant 10, which enables these field devices 19-22 to execute one or more process control loops either in conjunction with, or independently from the process controller 12. Of course, other types of devices and protocols such as the HART®, PROFIBUS®, WORLDFIP®, Device-Net®, AS-Interface and CAN protocols could be used as well.

The process controller 12 is configured to implement a control strategy using what are commonly referred to as function blocks. Each function block is a portion (e.g., a subroutine) of an overall control routine and operates in conjunction with other function blocks via communication links to implement process control loops within the process plant 10. Function blocks may perform either an input function, an output function, or a control function. A module is a container of measurement, calculations, and control implemented as function blocks and may contain other control modules. In general, the period of execution of a module, also known as the module execution rate, may be set by the end user of the control system based on the process speed of response to changes in process inputs. The input function may be associated with a transmitter, a sensor, or other process parameter measurement device. The output function may control the operation of some device, such as a valve, to perform some physical function within the process plant 10. The control function may be associated with a control routine that performs PID, fuzzy logic, etc. control. Of course hybrid and other types of function blocks exist. Function blocks may be stored in and executed by the process controller 12, which is typically the case when these function blocks are associated with standard 4-20 mA devices and some types of smart field devices. In addition, function blocks may be stored in and implemented by the field devices themselves, which is the case with smart devices.

Fieldbus Devices

While the Fieldbus protocol uses the term "function block" to describe a particular type of entity capable of performing a process control function, it is noted that the term function block as used herein is not so limited and includes any sort of device, program, routine, or other entity capable of performing a process control function in any manner at distributed locations within a process control network. Thus, the system described herein can be used with process plants 10 using other process control communication protocols or schemes (that may now exist or that may be developed in the future) which do not use what the Fieldbus protocol strictly identifies as a "function block."

As described above, communication with field devices 15-22 occurs using a process controller 12 and an output device 26 28 that receives signals 50 (FIG. 2) from the field devices 15-22. The output of the analog field devices 15-17 are measurement signals 50 which are in a wave form. The signals are sampled which means that a value of the field device output signal at a point in time is measured. Usually, many samples at intervals of time are taken to accurately observe the output signal and all the variations of the signal over time.

In process control systems, the analog signal 50 from field devices 15-17 is often converted from an analog signal 50 to a digital signal using an analog to digital convertor 40 and then the digital signal is utilized within the control system. While an analog signal 50 may have an endless variety of output within the maximum and minimum signals, the output from an analog to digital convertor 40 is usually a digital representation made up of 1's or a 0's where a 1 may be indicated by the signal being over a threshold value and a 0 being indicated by the signal being under the threshold value (or vice versa). Thus, the control system 12 sees the original analog signal in this digital representation.

As an example, consider an analog frequency of 250 Hz. Using a frequency of 250 Hz, the period of the signal is:

$t=1/f$ $t=1/250$ $t=4$ ms

The continuous time signal that may be sampled is then:

$x(t)=\sin(2*pi*f*t)$ $x(t)=\sin(2*pi*250*t)$

Figure 2:
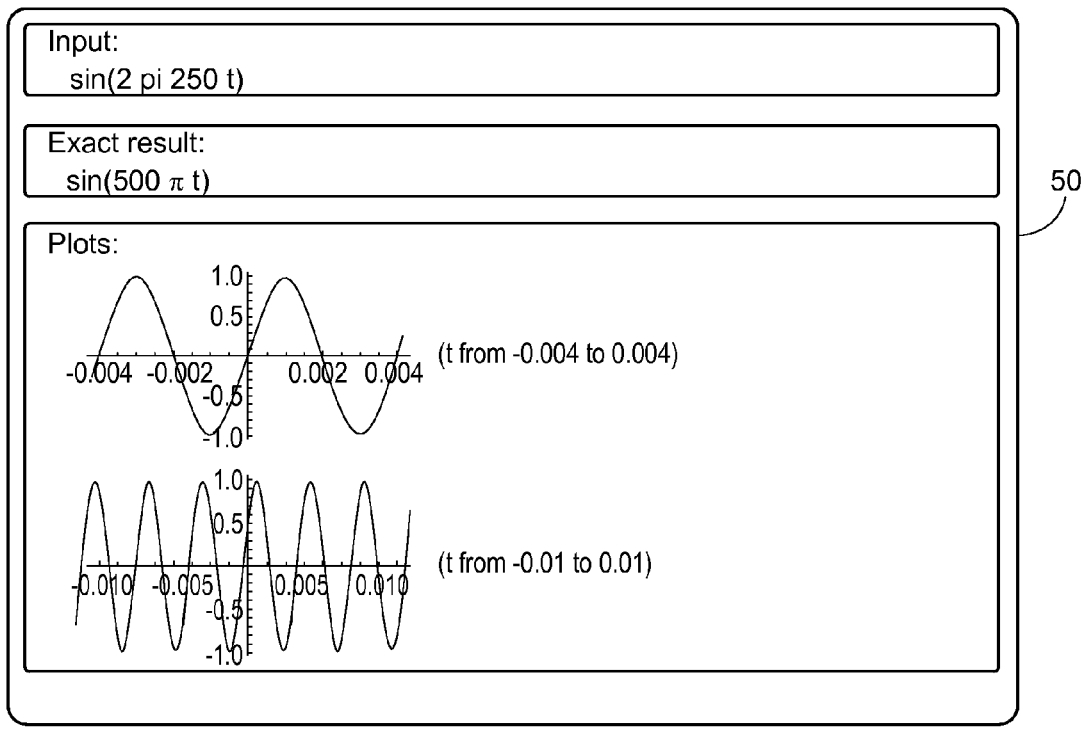
FIG. 2 is a diagram of a sample sinusoidal signal from a field device.

The plot of the signal over a time period of 24 ms is in FIG. 2

Figure 3A:
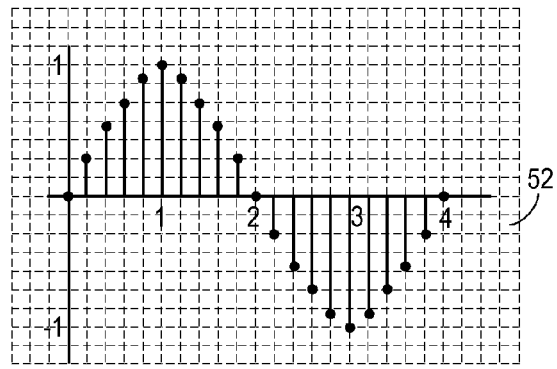
FIGS. 3A-3D illustrate the results of various samples per second on a given sinusoidal signal where sample rate is above the Nyquist frequency.

In FIG. 3A, if the sampling rate is 5,000 Hz, then the sampling interval will be:

$t=1/5{,}000=0.2$ ms which means that over the range of 4 ms, the system will take 20 samples. A result of the sample at 5,000 Hz is illustrated in FIG. 3A.

Figure 3B:
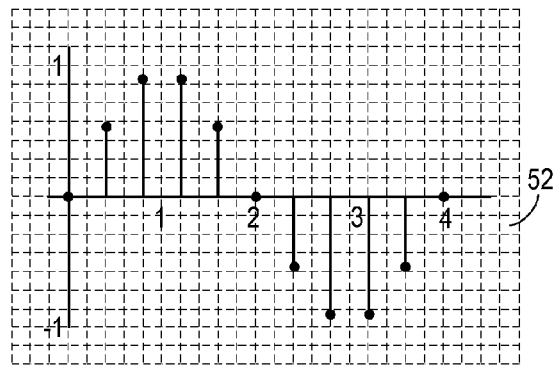
Figure 3C:
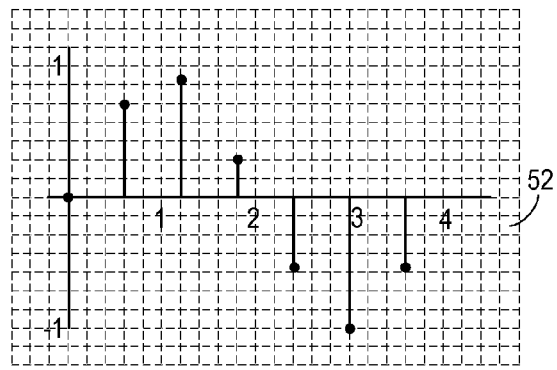
Figure 3D:
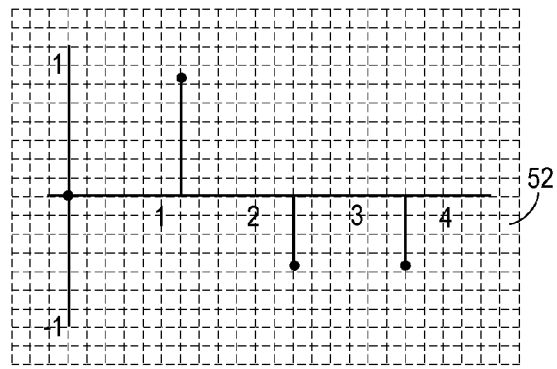
Figure 4A:
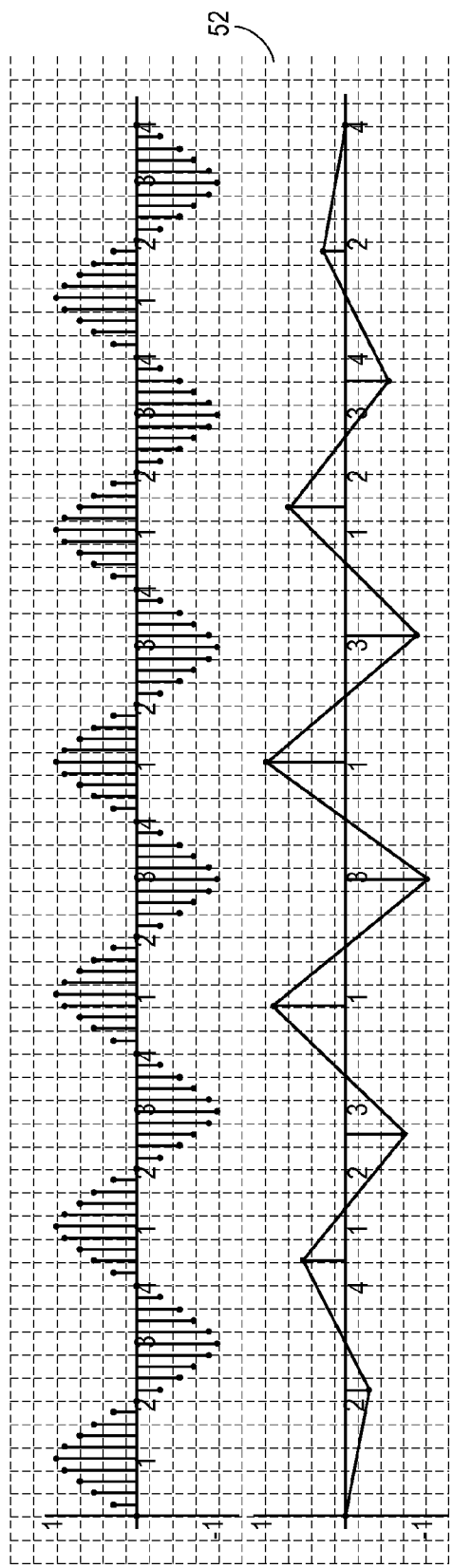
FIG. 4A illustrates the results of a slower sample per second on a given sinusoidal signal where sample rate is below the Nyquist frequency.
Figure 4B:
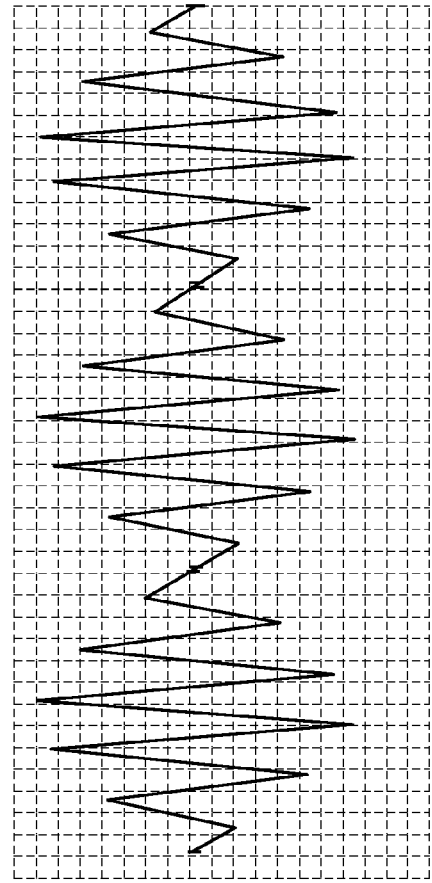
FIG. 4B illustrates the results of the resulting reconstructed signal from FIG. 4a being submitted to a control loop.

However, if the sampling frequency of the analog signal 50 is reduced by 50% to 2,500 Hz, the result is illustrated in FIG. 3B where the dots on the graph would be connected to create the sampled signal 52. Similarly, reducing the sampling interval to 0.6 ms (1,667 Hz), the result is illustrated in FIG. 3C where the dots on the graph would be connected to create the sampled signal 52. Finally, changing the sampling interval to 1.2 ms (833 Hz) is illustrated in FIG. 3D where the dots on the graph would be connected to create the sampled signal 52. Changing the sampling rate so that the signal is sampled every 2.4 ms (416.7 Hz) creates an entirely different (incorrect) signal that is illustrated in FIG. 4A where the dots on the graph would be connected to create the sampled signal 52. If the resulting signal 52 was fed through a control loop, it would create false variations in the measurement such as those illustrated in FIG. 4B.

As can be seen from this example, as the sampling rate is reduced, the ability of the control system to correctly capture the variation in the analog signal 50 is being reduced. When the sampling rate is no longer able to correctly capture the variation in the analog signal 50, "aliasing" has occurred. The frequency at which this occurs is called the Nyquist Frequency. Shannon's Theorem states that in order to sample an analog signal 50 correctly, the sampling rate must be at least 2× the highest frequency component present in the system. In the example used here and illustrated in FIGS. 3a-4b (which is 250 Hz signal), a sampling frequency of at least 500 Hz must be used.

The results when the control system samples below the Nyquist frequency is illustrated in FIG. 4A. In FIG. 4A, the analog signal 50 was sampled at 416.7 Hz. If the analog signal 50 is sampled at a sampling rate smaller than twice the Nyquist frequency, false lower frequency component(s) appears in the sampled data. When the Nyquist rule is violated, higher frequency components fold back and distort the sample values. Such distortion due to process noise can cause increase variation in control and excessive wear on field device 15-17, for example.

Figure 5:
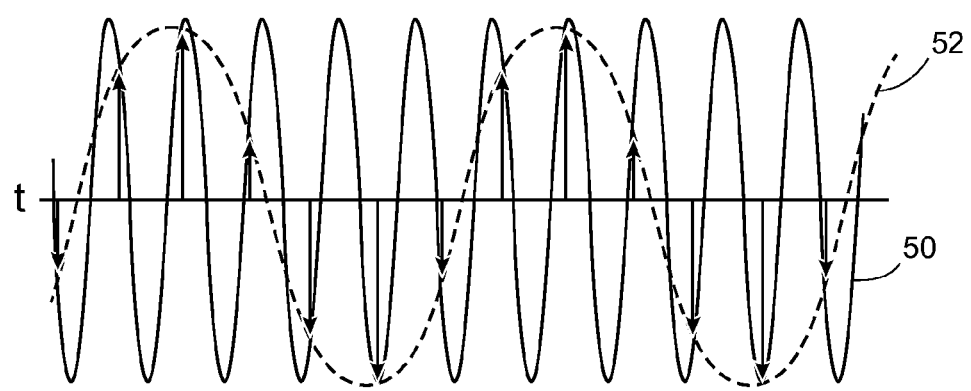
FIG. 5 illustrates the resulting reconstructed signal that results from undersampling.

As another illustration, FIG. 5 illustrates a 5 MHz sine wave 50 digitized by a 6 MS/s analog to digital convertor 40. The dotted line indicates the aliased signal 52 recorded by the analog to digital convertor 40. The 5 MHz frequency aliases back in the pass-band, falsely appearing as a 1 MHz sine wave. If a control system used the resulting signal 52, an error due to a false reading could occur.

The performance that may be achieved using a distributed control system (DCS) as illustrated in FIG. 1 may be determined by the control loop execution rates, the delay introduced by input output processing, and the process dynamics. At a high level, to achieve control performance, the control loop execution rate may be set based on the process dynamics. For any selected control loop execution rate, the input output processing delay should be minimized and filtering provided to avoid aliasing of measurement data.

Anti-Aliasing Filtering

Modern analog to digital (A/D) convertors internally run at a very high sample rate. Often, a hardware analog filter is required to remove any frequencies above ½ the internal sample rate, i.e. the Nyquist frequency, for the analog to digital convertor 40.

In addition, a digital finite impulse response (FIR) digital filter may be provided as part of the analog to digital convertor 40 to remove noise pickup such as 50 or 60 Hz ac frequency and eliminate frequencies above the Nyquist frequency of the application that utilizes the analog to digital convertor 40 output. As the execution rate of control loops is configurable, the Nyquist frequency to avoid aliasing at the control loop varies as shown below.

TABLE 1

| Module Execution Period | Nyquist Frequency |
| --- | --- |
| 100 msec | 5 Hz |
| 200 msec | 2.5 Hz |
| 500 msec | 1 Hz |
| 1 sec | 0.5 Hz |
| 2 sec | 0.25 Hz |
| 5 sec | 0.1 Hz |
| 10 sec | 0.05 Hz |
| 30 sec | 0.016 Hz |
| 60 sec | 0.008 Hz |

Thus, as the module Nyquist frequency varies with module execution rate, a fixed digital filter cannot be used to avoid all aliasing.

Figure 6A:
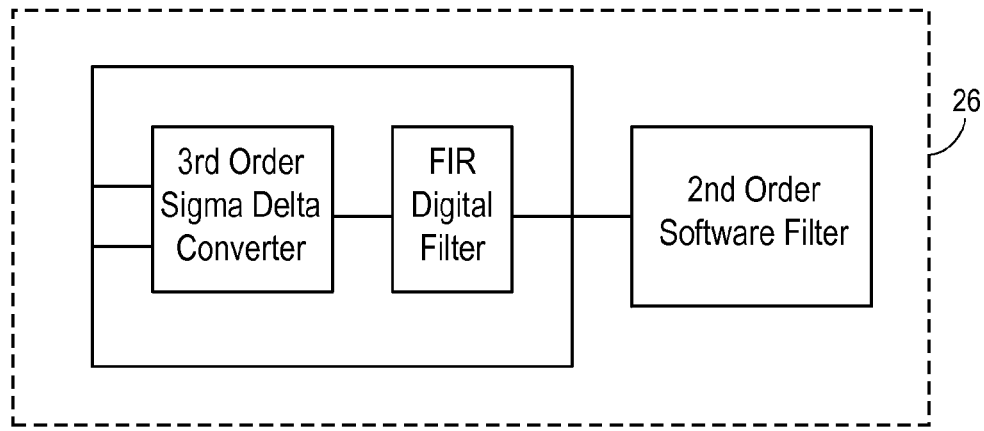
FIGS. 6A and 6B illustrates sample analog input cards and their filters.
Figure 6B:
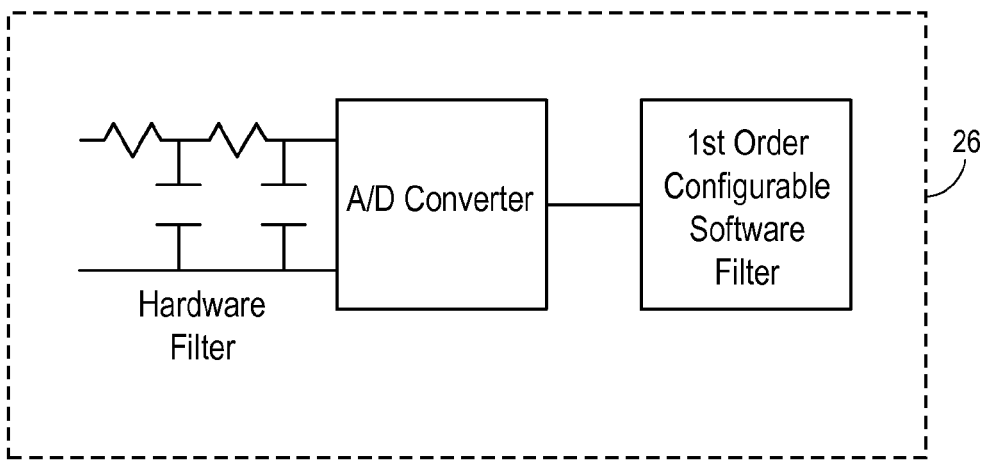

For example, some analog input cards 26 in the process control system use filters to assist in protecting against unwanted signals in the 50-60 Hz range. FIGS. 6A and 6B may be illustrations of some sample analog input cards 26. In FIG. 6B, the input card 26 may be a DeltaV analog input card and it may use a two pole filter hardware (resistor capacitor (RC)) filter to provide attenuation in the 50-60 Hz range. In one embodiment, the effect of this filter in combination with a $1^{st}$ order digital filter following the analog to digital converter may provide −3 dB attenuation at 2.7 Hz and more than −40 dB attenuation in the 50-60 Hz range.

FIG. 6A may be a CHARM analog input card 26 which may use the analog to digital software finite impulse response (FIR) filter and additional software filter after the analog to digital convertor which also may provide attenuation assistance. In one embodiment, the effect of this filter in combination with a $2^{nd}$ order digital filter following the analog to digital converter may provide −3 dB attenuation at 2.7 Hz and more than −40 dB attenuation in the 50-60 Hz range. However, depending on the design of the finite response filter (FIR) the filtering after the analog to digital convert to prevent aliasing of control loop data may be less effective because at this point the analog data is already aliased.

In some current embodiments, the analog to digital convertor 40 used may be the Texas Instruments TI-ADS 1246/7/8 and the analog to digital convertor 40 may sample inputs at 50 ms intervals. The output of these analog to digital convertors 40 may then be passed through a first-order software filter before being communicated to control module that may operate in the process controller 12, for example. The software filter can be adjusted to match the control module execution rate.

There are several limitations with this approach:

1—Any noise that passes through the analog to digital convertor 40 circuitry is very difficult to remove from the actual signal that is being measured;

2—Software filters may introduce phase shift; and

3—Interference and process noise will show up as aliasing.

Nyquist Frequency Attenuation

Figure 7:
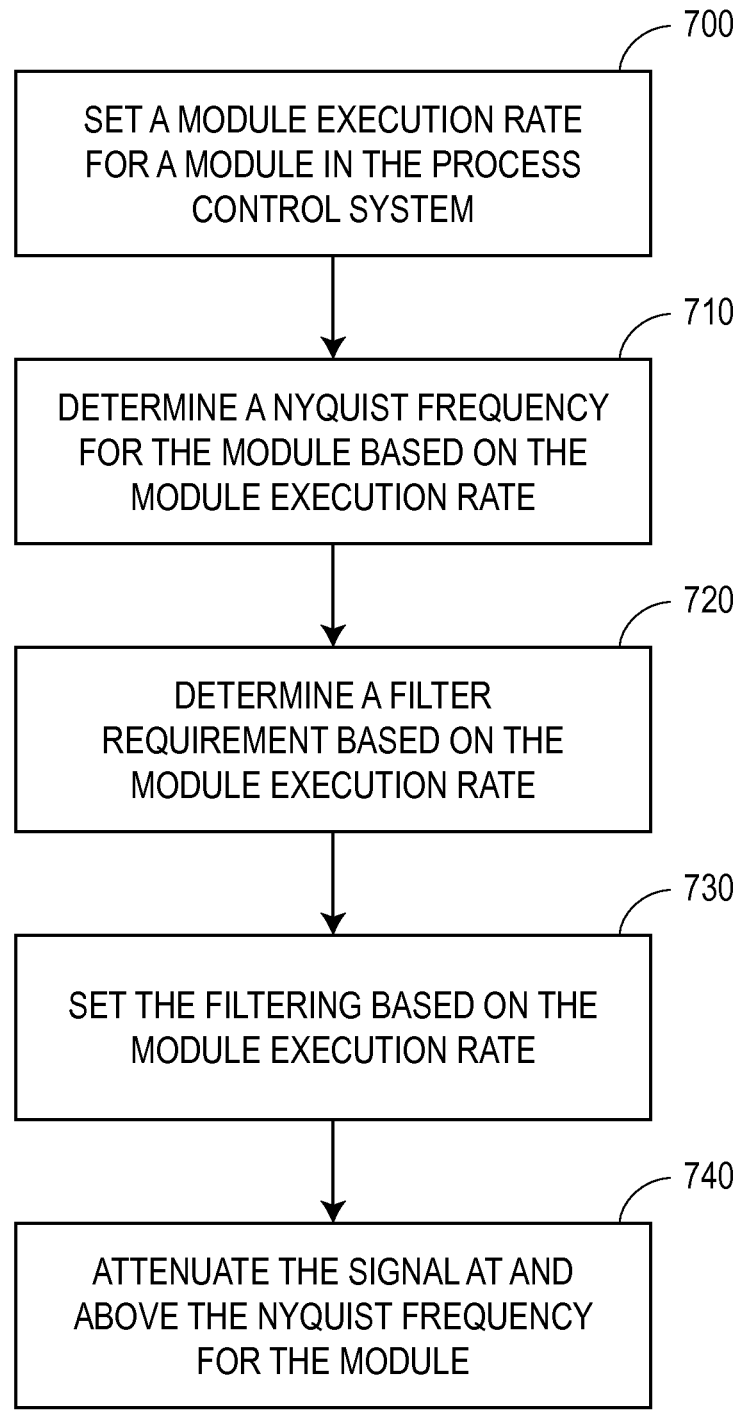
FIG. 7 illustrates a method for eliminating aliasing in a process control environment.

FIG. 7 illustrates a method of reducing aliasing in a process control system in a process plant 10. At a high level, a filter 42 (FIG. 8) may be used to remove frequencies above the module Nyquist frequency before the analog signals 50 are converted from analog signals 50 to digital signals by the analog to digital convertor 40. The Nyquist frequency may be determined as being twice the module execution rate. The filter 42 may be part of the analog to digital convertor 40 or may be part of any of the apparatus in the process control system before the analog signal 50 is converted by the analog to digital convertor 40. As an example and not limitation, the method or apparatus 42 may be part of a field device 15-17. As a result, aliasing will be significantly reduced and significantly better process plant 10 performance may occur.

As the fastest control module today usually run at 100 ms, 20 samples per second (SPS) may be used to sample the input signal 50. At this sample rate, the analog to digital finite impulse response digital filter in an input card 26 such as those in FIG. 6A and 6B may do an excellent job of removing alternating current (ac) pick-up with >−70 dB attenuation at 50 and 60 Hz. However, the −3 dB bandwidth in the analog to digital output is 14.8 Hz—as shown in the following table—is much greater that the Nyquist frequency associated with control loop execution.

TABLE 2

| DATA RATE (SPS) | −3 dB BAND-WIDTH (Hz) | ATTENUATION | | | |
|---|---|---|---|---|---|
| | | $f_{IN}=$ 50 Hz ± 0.3 Hz (dB) | $f_{IN}=$ 60 Hz ± 0.3 Hz (dB) | $f_{IN}=$ 50 Hz ± 1 Hz (dB) | $f_{IN}=$ 60 Hz ± 1 Hz (dB) |
| 5 | 2.26 | −106 | −74 | −81 | −69 |
| 10 | 4.76 | −106 | −74 | −80 | −69 |
| 20 | 14.8 | −71 | −74 | −66 | −68 |
| 40 | 9.03 | | | | |
| 80 | 19.8 | | | | |
| 160 | 118 | | | | |
| 320 | 154 | | | | |
| 640 | 495 | | | | |
| 1000 | 732 | | | | |
| 2000 | 1465 | | | | |

TABLE 2-continued

Thus, the standard analog to digital finite impulse response digital filter in analog input cards 26 when running at 20 samples per second provides no protection at the control loop level from aliasing of process noise in the 0-14.8 Hz range. Thus, based on the module execution rate, any frequency content between the Nyquist frequency for the module execution rate and 14.8 Hz will fold back and distort the signal 50 used in closed loop control. Such a distortion can lead to excessive valve cycling, and increase variability about setpoint.

Referring again to FIG. 7, at block 700, a module execution rate for a module in the process control system may be determined. The module execution rate may be determined in any logical way, such as querying the process controller 12 or by querying the control software that sets the module execution rate. In addition, the module execution rate may be adjustable. A default value may be provided and the default value may be 1/sec. However, to reduce controller 12 load, the module execution rate may be adjustable. Thus, the module execution rate may need to be determined.

In some embodiments, module control loops may have execution rates which may be set by users. The module execution rate may be selected from a plurality of preset module execution rates or may be any number that can be understood and executed by the controller 12 in the process control system. Many control loops in process control environments have a plurality of set values that may be selected for the execution rates. As an example and not limitation, the DeltaV® control system that may operate on the workstations 13 14 allows users to select execution rates of 100, 200 and 500 msec and 1, 2, 5, 10 30 and 60 seconds. To achieve the desired control performance, the control loop execution rate may be set fast enough to allow the process dynamics to be accurately reflected in the closed loop response.

The rule of thumb for setting the loop execution period is that the control loop execution period should be at least four (4) times faster than the process response time. The quality of control will be noticeably degraded when a control loop is configured to execute slower than four times the process response. The process response time of a self-regulating process may be approximated as first order (time for a device to take an action) plus deadtime and the process response time is assumed to be the process deadtime plus the process time constant. For integrating processes, the process response time may be assumed to be the deadtime plus the time required for a significant response to a change in the process input.

In a simple example, if the process response time is 1 second, then the control loop execution period should be 4 samples per second. Further, if the control loop execution period is 4 samples per second, the Nyquist frequency would be twice the control loop execution period (4 samples per second) or 8 samples per second. Configuring a control loop to execute faster than four times the process response time will provide little if any improvement in the control response to setpoint and load disturbance. However, the quality of control will be noticeably degraded when a control loop is configured to execute slower than four times the process response. Also, at these slower execution rates the loop must be de-tuned tuned to provide stable response, i.e., proportional gain reduced and reset time increased.

In another embodiment, the module execution rate may be calculated by the controller 12 in the process control system. As an example and not limitation, one or more sample commands may be sent through the process control system and the time for the response may be determined. Based on the time for the response, the module execution rate may be calculated such as being four times faster than the response rate. In addition, the system may use other modules that are operating at known execution rates and times and may compare the present execution time to the known execution time to make an estimate at the execution time.

The process response time may also be determined based on the type of equipment. As mentioned previously, the process response time of a self-regulating process may be approximated as first order (time for a device to take an action) plus deadtime and the process response time is assumed to be the process deadtime plus the process time constant. For integrating processes, the process response time may be assumed to be the deadtime plus the time required for a significant response to a change in the process input.

At block 710, a Nyquist frequency may be determined for the module based on the module execution rate. As described previously, the Nyquist frequency may be used to set the filtering required to avoid aliasing. Also, as noted previously, the Nyquist frequency may vary by module meaning the Nyquist frequency may need to be calculated for each module in question for the Nyquist frequency to be accurately determined.

The Nyquist frequency is two times the module execution rate of the module in the process control system. In some embodiments, the Nyquist frequency is predetermined based on the plurality of given module execution rates. In other embodiments, the Nyquist frequency is calculated at runtime based on the determined module execution rate from block 700. Some sample module execution periods and related Nyquist Frequency are listed below.

TABLE 3

| Module Execution Period | Nyquist Frequency |
|---|---|
| 100 msec | 5 Hz |
| 200 msec | 2.5 Hz |
| 500 msec | 1 Hz |
| 1 sec | 0.5 Hz |
| 2 sec | 0.25 Hz |
| 5 sec | 0.1 Hz |
| 10 sec | 0.05 Hz |
| 30 sec | 0.016 Hz |
| 60 sec | 0.008 Hz |

At block 720, in some embodiments, the filter requirement may be determined based on the module execution rate of block 700. A look up table or pre-filled database may be used to propose filtering based on the module execution rate. In another embodiment, the filtering may be calculated. In yet a further embodiment, a computational source such as workstations 13 14 may be contacted through the filtering based on the module execution rate data or other relevant data, such as input output delays, deadtime, etc. In other embodiments, the filtering after the analog to digital convertor 40 may be determined by a separate process or apparatus.

At block 730, in the analog to digital convertor 40 that may be communicatively coupled to received the analog communications 50 from the field devices 15-17 in the process plant 10, the filtering may be set based on the module execution rate. In this way, a module execution rate may be selected and a recommendation for the filtering in the analog to digital convertor 40 may be given. In another embodiment, the filtering in the analog to digital convertor 40 may be automatically set based on the selected module execution rate. In some additional embodiments, a filtering in the analog to digital convertor 40 may be selected and a recommendation for the module execution rate may be given. In another embodiment, the module execution rate may be automatically set based on the sampling rate and filtering in the analog to digital convertor 40.

The filtering may be selected from a plurality of preset data sampling rates either by the control system or by the user. The filtering may be presented as a drop down box or any other appropriate user input display. In some embodiments, the filtering may be set in the analog to digital convertor 40 from the process control system. In some embodiments, the filtering is set as a default value that may be edited by a user. The filtering may be adjusted in a variety of ways, including, but not limited to adjusting a filter time constant or adjusting the coefficients of the digital filter to achieve the desired attenuation.

In some additional embodiments, a user may set a data sampling rate and the control loop execution period may be adjusted based on the data sampling rate. In practice, some users may be more comfortable adjusting a data sampling rate. The adjustment to the control loop execution period may be automatically changed, may be set to a default that may be changed by a user or the user may be encouraged to change the control module execution manually.

At block 740, the module signal may be attenuated at and above the Nyquist frequency for the module. In some embodiments, an adjustable digital filter 42 is part of the analog to digital convertor 40. In fact, in some embodiments, the filter 42 may be a low pass analog to digital finite impulse response digital filter 42 that may already be in the analog input card 26. If the filter 42 exists in the analog to digital input card 26, then the new tuning parameters simply have to be communicated to the filter 42 and the filter 42 may attenuate the signal as desired. Further, the attenuation may be varied as the module rate is varied, to avoid overtaxing the controller 26 and to avoid attenuating signals that may not need to be attenuated based on the current module rate. In the situation where the existing filter in the analog to digital convertor 40 is used, significant cost savings may be had as the updated tuning parameters have to be provided to the existing filter 42.

In one embodiment, the filter 42 will contain all the necessary data to adjust the signal to obtain the desired attenuation. For example, if the data rate is set to 20 SPS, the filter 42 will know how to adjust the filter coefficients to obtain the desired attenuation for a module execution rate. The coefficients may be stored in a local memory, a remote memory or may be quickly obtainable from an additional memory or by a determination.

In another embodiment, when the module execution rate is changed for a filter 42, the necessary filter coefficients to obtain the desired attenuation may also be communicated to the filter 42. In this way, the necessary filter coefficients may be "pushed" to the filter 42 rather than having the filter 42 have to "pull" the filter coefficients. In yet another embodiment, when a user changes the module execution rate, a display may appear to a user suggesting that the user adjust the digital filter in a way to reduce any aliasing potential. In this way, any noise in the process may be addressed to ensure that there is no aliasing at the module level.

In some embodiments, attenuating the signal may entail implementing a filter 42 on the analog signal 50 at a point in the process before and/or after the analog signal 50 is sampled by the analog to digital convertor 40. Logically, any appropriate filter 42 may be used. In one embodiment, the filter 42 is a low pass analog to digital finite impulse response digital filter that attenuates signals 50 beyond the Nyquist frequency of the analog to digital converter. In some embodiments, the attenuation at the Nyquist frequency associated with the module execution rate is at least −12 dB and the attenuation at 50 Hz to 60 Hz is at least −40 dB. Of course, the attenuation may be higher. As the signal is attenuated, the signal will not fold back onto itself and cause aliasing problems. In addition, the attenuation will occur before the analog to digital conversion, eliminating conversion errors.

As a result, better control of the plant process 10 may be obtained as the Nyquist attenuation frequency may be determined for each specific module in a process control system. Further, the attenuation frequency may be adjusted as the module changes, such as new field devices 15-17 are added, removed, changed, etc., communication links are modified, process solutions are changed, etc. Fewer erroneous readings may be had which may lead to premature wear on field devices 15-17 such as excessive valve cycling, and increase variability about setpoint. In addition, the control of the process will be more precise as readings from field devices 15-17 will be properly converted and interpreted. As a further result, less time will be spent on attempting to diagnose problems and errors that may be attributed to the erroneous readings which may have been caused by signal aliasing.

Figure 8:
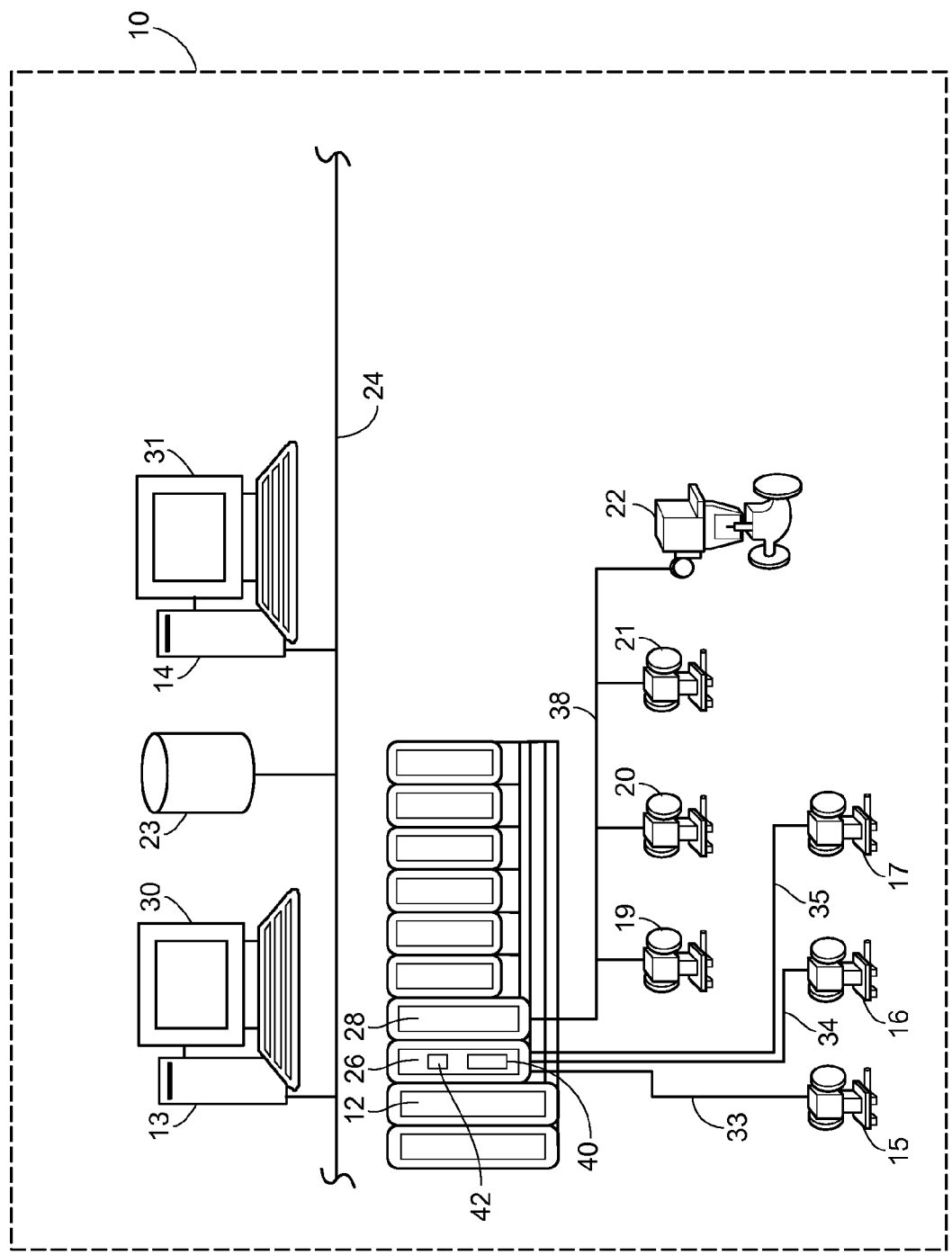
FIG. 8 illustrates a system for reducing aliasing in a process control system.

FIG. 8 may illustrate a sample embodiment of apparatus that may be used to reduce aliasing in the process control system. The process control module may include field devices 15-17, an analog input/output device 26 and a controller 12. The controller 12 may calculate the Nyquist frequency for the process control module 12 based on the execution rate of the module. The controller may also calculate the filtering applied after the analog to digital convertor 40 based on the execution rate and it may be four times the execution rate.

An input/output device 26 may be in communication with the field devices 15-17 via analog communication lines 33-35. The analog to digital convertor 40 may be part of the input device 26. In another embodiment, the analog to digital convertor 40 may be separate from the input/output device 26 but may be in communication with the input device 26.

The filter 42 associated with the field devices 15-17 and the input device 26 may attenuate analog signals 50 above the calculated Nyquist frequency of the analog to digital converter before the analog signal 50 is converted from analog form to digital form. As mentioned previously, the filter 42 may be applied after the analog to digital converter to attenuate frequencies beyond the determined Nyquist frequency for the module. In one embodiment, the filter 42 after the analog to digital converter is a low pass analog to digital finite impulse response digital filter that attenuates frequencies beyond the module Nyquist frequency. In some embodiments, the attenuation at the Nyquist frequency is at least −12 dB and the attenuation at 50 Hz to 60 Hz is at least −40 dB. Of course, the attenuation may be higher.

As previously noted, in some embodiments, the digital filter may be part of the analog to digital convertor 40. In fact, in some embodiments, the filter may be a low pass analog to digital finite impulse response digital filter that may already be in the analog input card 26 that requires new tuning parameters and the filter may attenuate the signal frequency content after the analog to digital converter.

It should be understood that the filter 42, and any component thereof, including the analog to digital convertor 40, etc. may be implemented in hardware, software, firmware, or any combination thereof. In any event, the recitation of a routine stored in a memory and executed on a processor includes hardware and firmware devices as well as software devices. For example, the components described herein may be implemented in a standard multipurpose CPU, or on specifically designed hardware or firmware such as an ASIC or other hardwired devices, and still be a routine executed in a processor. When implemented in software, the software routine may be stored in any computer readable memory such as a magnetic disk, a laser disk, an optical disk, a RAM, ROM, EEPROM, a database, or any other storage medium known to those skilled in the art.

Thus, while the present improvement has been described with reference to specific examples, which are intended to be illustrative only and not to be limiting of the invention, it will be apparent to those of ordinary skill in the art that changes, additions, or deletions may be made to the disclosed embodiments without departing from the spirit and scope of the invention.

The invention claimed is:

1. A method of reducing aliasing in a process control system wherein the process control system comprises at least one analog device and an analog to digital convertor, the method comprising:
    setting a module execution rate for a module in the process control system;
    determining a Nyquist frequency for the module based on the module execution rate;
    determining a filtering after the analog to digital convertor based on the module execution rate;
    in the filter after the analog to digital convertor, setting the data sampling rate in the analog to digital convertor based on the module execution rate; and
    attenuating a frequency content of the measurement signal at and above the Nyquist frequency for the module.

2. The method of claim 1, wherein the Nyquist frequency is two times the frequency at which the module is executed.

3. The method of claim 1, wherein the attenuating the module signal comprises implementing a low pass digital finite impulse filter after the analog to digital converter to attenuate frequency content in the measurement signal beyond the Nyquist frequency associated with the frequency at which the module executes.

4. The method of claim 1, wherein the attenuation at the Nyquist frequency is at least −12 dB.

5. The method of claim 1, wherein the attenuation at 50 Hz to 60 Hz is at least −40 dB.

6. The method of claim 1, wherein the module execution rate is selected from a plurality of preset module execution rates.

7. The method of claim 6, wherein the Nyquist frequency is predetermined based on the plurality of preset module execution rates.

8. The method of claim 1, wherein the digital filter after the analog to digital converter may be set from the process control system.

9. The method of claim 1, wherein the process control system executes a control loop at least four times over the process response time.

10. The method of claim 9, wherein the process response time in a self regulating process comprises first order time plus deadtime and wherein the process response time in an integrating process comprises the deadtime plus the time required for a significant response to a change in a process input.

11. A system for reducing aliasing in a process control system comprising
   a process control module in the process control system that operates at a determined execution rate wherein the process control system comprises:
      field devices that provide analog output,
      an input/output device communicatively coupled with the field devices and a controller wherein the controller calculates a Nyquist frequency for the process control module based on the execution rate;
      an analog to digital convertor communicatively coupled with the input/output device; and
      a filter in communicatively coupled with the analog to digital convertor that attenuates a the frequency content if the measurement signal above the Nyquist frequency after the module signal is converted from analog form to digital form by the analog to digital convertor.

12. The system of claim 11, wherein the Nyquist frequency is two times the module execution rate in the process control system.

13. The system of claim 11, wherein the attenuating the module signal comprises implementing a low pass digital finite impulse response digital filter after the analog to digital converter to attenuate frequencies in the measurement signal beyond the Nyquist frequency associated with the module execution rate.

14. The system of claim 11, wherein the attenuation at the Nyquist frequency is at least −12 dB and wherein the attenuation at 50 Hz to 60 Hz is at least −40 dB.

15. The system of claim 11, wherein module execution rate is selected from a plurality of preset module execution rates and the Nyquist frequency is predetermined based on the plurality of preset module execution rates.

16. The system of claim 11, wherein the control loop executes at least four times over the process response time and wherein the process response time in a self regulating process comprises first order time plus deadtime and wherein the process response time in an integrating process comprises the deadtime plus the time required for a significant response to a change in a process input.

17. The system of claim 11, wherein measurement filtering may be set in the analog to digital convertor from the process control system.

18. A computer system comprising a processor physically configured according to computer executable instructions for reducing aliasing in a process control system, a memory physically configured to store the computer executable instructions, an analog field device and an analog input/output device comprising an analog to digital convertor, the computer executable instructions comprising instructions for:
   setting a module execution rate for a module in the process control system;
   determining a Nyquist frequency for the module based on the module execution rate wherein the Nyquist frequency is two times the module execution rate;
   determining filtering to be applied after the analog to digital convertor based on the module execution rate;
   in the analog to digital convertor, setting the filtering applied after the analog to digital convertor based on the module execution rate; and
   attenuating a module signal at and above the Nyquist frequency for the module.

19. The computer system of claim 18, wherein the control loop execution rate is set at least four times as fast at a process response time and wherein the process response time in a self regulating process comprises first order time plus deadtime and
   wherein the process response time in an integrating process comprises the deadtime plus the time required for a significant response to a change in a process input.

20. The computer system of claim 18, wherein the attenuation at the Nyquist frequency is at least −12 dB and wherein the attenuation at 50 Hz to 60 Hz is at least −40 dB.

* * * * *